(12) United States Patent
Okigawa (10) Patent No.: US 7,109,062 B2
(45) Date of Patent: Sep. 19, 2006

(54) SEMICONDUCTOR INTEGRATED DEVICE INCLUDING SUPPORT SUBSTRATE FASTENED USING RESIN, AND MANUFACTURING METHOD THEREOF

(75) Inventor: Mitsuru Okigawa, Nagoya (JP)

(73) Assignee: Sanyo Electric Co., Ltd., Osaka (JP)

( * ) Notice: Subject to any disclaimer, the term of this patent is extended or adjusted under 35 U.S.C. 154(b) by 111 days.

(21) Appl. No.: 10/773,088

(22) Filed: Feb. 5, 2004

(65) Prior Publication Data

US 2005/0009238 A1 Jan. 13, 2005

(30) Foreign Application Priority Data

Feb. 6, 2003 (JP) .............. 2003-029957
Nov. 13, 2003 (JP) .............. 2003-383430

(51) Int. Cl.
| | |
|---|---|
| H01L 21/48 | (2006.01) |
| H01L 21/44 | (2006.01) |
| H01L 23/29 | (2006.01) |
| H01L 23/48 | (2006.01) |
| H01L 23/28 | (2006.01) |
| H01L 23/24 | (2006.01) |

(52) U.S. Cl. .................. 438/118; 438/124; 438/122; 438/126; 438/113; 257/753; 257/789; 257/795; 257/E23.14; 257/E23.16; 257/E23.116

(58) Field of Classification Search ........ 257/431–435, 257/789–790; 438/48, 69, 127
See application file for complete search history.

(56) References Cited

U.S. PATENT DOCUMENTS

| | | | | |
|---|---|---|---|---|
| 5,749,997 A | * | 5/1998 | Tang et al. ............ | 156/249 |
| 5,930,599 A | * | 7/1999 | Fujimoto et al. ........ | 438/113 |
| 6,103,553 A | * | 8/2000 | Park ....................... | 438/119 |
| 6,133,637 A | * | 10/2000 | Hikita et al. ............ | 257/777 |
| 6,157,080 A | * | 12/2000 | Tamaki et al. .......... | 257/738 |
| 6,168,965 B1 | * | 1/2001 | Malinovich et al. ..... | 438/66 |
| 6,209,196 B1 | * | 4/2001 | Ozono et al. ........... | 29/840 |
| 6,265,782 B1 | * | 7/2001 | Yamamoto et al. ..... | 257/783 |
| 6,297,564 B1 | | 10/2001 | Chung | |
| 6,317,326 B1 | * | 11/2001 | Vogel et al. ............. | 361/704 |
| 6,321,734 B1 | * | 11/2001 | Kaminaga et al. ...... | 123/634 |
| 6,498,051 B1 | * | 12/2002 | Watanabe ................ | 438/106 |
| 6,507,095 B1 | * | 1/2003 | Hashimoto .............. | 257/676 |
| 6,580,173 B1 | * | 6/2003 | Okada et al. ............ | 257/774 |
| 6,730,731 B1 | * | 5/2004 | Tobita et al. ............ | 524/495 |
| 6,777,767 B1 | * | 8/2004 | Badehi .................... | 257/432 |
| 6,791,168 B1 | * | 9/2004 | Connell et al. .......... | 257/668 |

(Continued)

FOREIGN PATENT DOCUMENTS

KR  2001-0083235  8/2001

(Continued)

OTHER PUBLICATIONS

URL http://www.shellcase.com/pages//products-shellOP-process.asp.

*Primary Examiner*—Luan Thai
(74) *Attorney, Agent, or Firm*—Hogan & Hartson LLP (57) ABSTRACT

A semiconductor integrated device, provided with a semiconductor chip on which a semiconductor integrated circuit is formed and a support substrate laminated on at least one surface of the semiconductor chip, wherein the semiconductor chip and the support substrate are fastened using resin having particle-the minimum film thickness of the resin is larger than the maximum particle diameter of the filler.

5 Claims, 8 Drawing Sheets

U.S. PATENT DOCUMENTS

| | | |
|---|---|---|
| 6,798,072 B1 | 9/2004 | Kajiwara et al. |
| 6,821,657 B1 * | 11/2004 | Takahashi et al. ... 257/E21.503 |
| 6,867,492 B1 * | 3/2005 | Auburger et al. ........... 257/706 |
| 2001/0016372 A1 | 8/2001 | Murakami |

FOREIGN PATENT DOCUMENTS

| | | |
|---|---|---|
| KR | 2002-0036669 | 5/2002 |

* cited by examiner

SEMICONDUCTOR INTEGRATED DEVICE INCLUDING SUPPORT SUBSTRATE FASTENED USING RESIN, AND MANUFACTURING METHOD THEREOF

BACKGROUND OF THE INVENTION

1. Field of the Invention

The present invention relates to a semiconductor integrated device having a support substrate fastened to at least one surface of a semiconductor chip so as hold resin mixed with microparticles (Filler) between the semiconductor chip and the support substrate, and a method of manufacturing the same.

2. Description of the Related Art

Recently, chip-sized packages (CSP) such as ball grid arrays (BGA) have been widely used in order to reduce the size of chips for implementing semiconductor integrated devices. For example, in order to miniaturize a digital camera that uses a. CCD image sensor, a chip-sized package is adopted in the implementation of the CCD image sensor.

Figure 8:
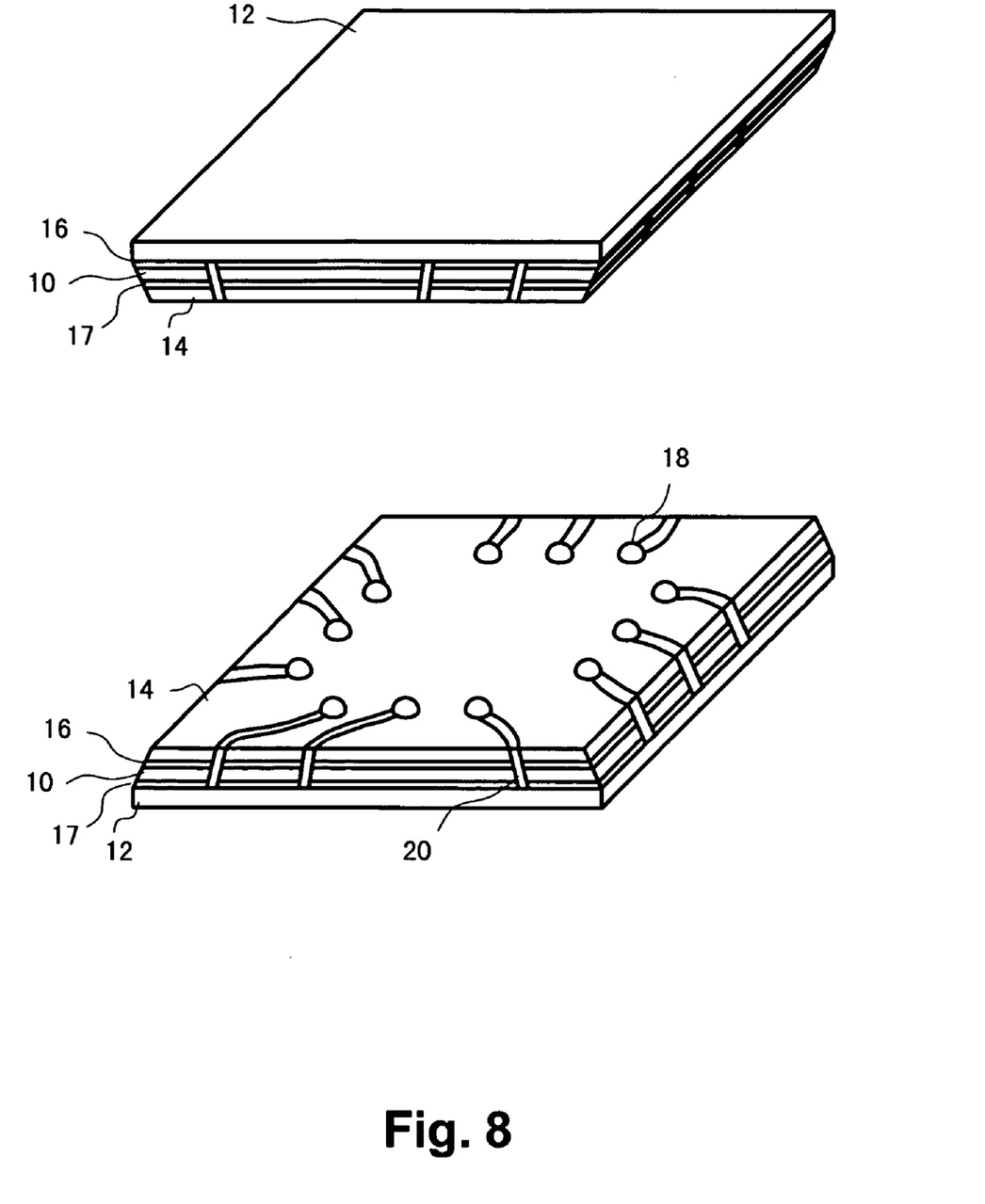
FIG. 8 is a drawing showing an outline of a semiconductor integrated device implemented in a chip-sized package.

FIG. 8 is a perspective view of one example of a semiconductor integrated device applying a chip-sized package, viewed from the front surface and a rear surface.

First and second support substrates 12, 14 are fastened to the front surface and rear surface of a semiconductor chip 10 using insulating resin 16, 17, and the first and second support substrates 12, 14 not only increase the structural strength of the semiconductor chip 10, but also protect against contamination from the outside. A plurality of ball shaped terminals 18 are provided on an outer surface of the second support substrate 14, and inner wiring of the semiconductor chip 10 and the ball-shaped terminals 18 are connected using external wiring 20. It is possible to establish contact between the semiconductor chip 10 and external elements using the ball shaped terminals 18.

Figure 9:
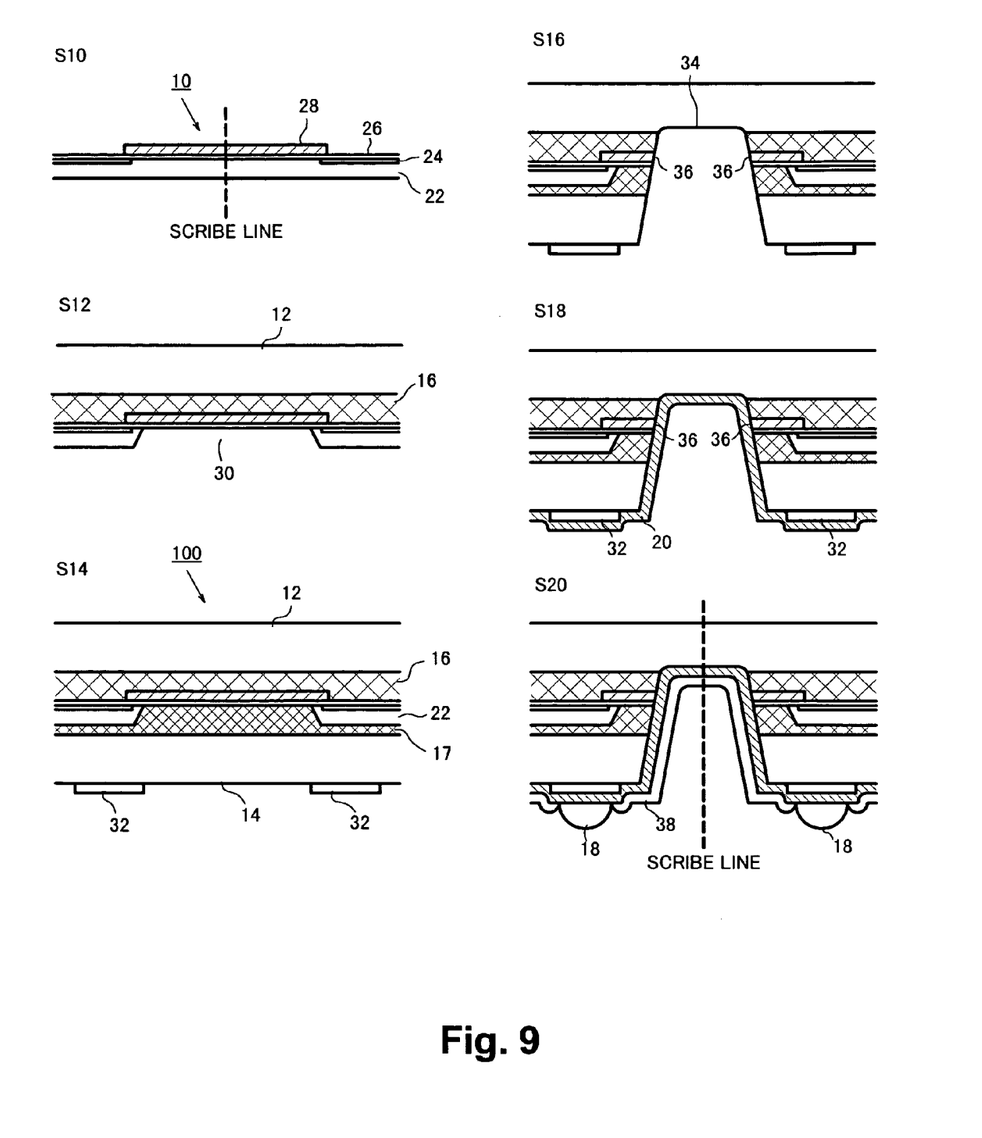
FIG. 9 is a process flow drawing for a semiconductor integrated circuit of the related art.

FIG. 9 is a process flowchart for a semiconductor integrated device adopting a chip-sized package. Here, in order to clarify the description, part of a semiconductor substrate 22 is shown expanded schematically. Separate semiconductor integrated circuits 24 divided by a scribe line are formed on the surface of the semiconductor substrate 22. An insulating film 26 such as an oxide film is formed on the semiconductor integrated circuits 24, and inner wiring 28 connecting to wiring inside the semiconductor integrated circuits 24 is arranged on the insulating film 26. The inner wiring 28 is used to achieve contact between the semiconductor integrated circuits 24 and external parts (S10).

Next, a first support substrate 12 is fastened to the front surface of the semiconductor substrate 22 with an insulating resin material 16, constituting an adhesive, interposed between the two. After that, the semiconductor substrate 22 is made into a thin film by subjecting it to a grinding process from the rear surface. Next, etching processing is carried out from the rear surface side of a semiconductor chip 10 along scribe lines dividing the semiconductor integrated circuits 24, to expose the insulating film 26 between adjacent semiconductor integrated circuits 24 (S12).

Next, a second support substrate 14 is fastened to the rear surface of the semiconductor substrate 22 with an insulating resin material 17, constituting an adhesive, interposed between the two, and a laminated body 100 is formed by sandwiching the semiconductor substrate 22 with the first and second support substrates 12, 14. Also, buffer members 32 are provided on the outer surface of the second support substrate at positions where ball-shaped terminals will later be arranged. These buffer members 32 play a cushioning role for softening stress acting on the ball-shaped terminals 18.

Next, using a dicing saw, an inverse V-shaped groove 34 is formed by cutting along the scribe lines from the second support substrate 14 side (S16). The inner wiring 28 of a contact section 30 is also disconnected by cutting, and end sections 36 of the inner wiring 28 are exposed at the inner surface of the grove 34.

A metal film is formed on an outer surface of the second support substrate 14 and the inner surface of the groove 34, and outer wiring 20 is formed by performing patterning of this metal film using a photolithography technique. The outer wiring 20 is patterned so as to connect between end sections 36 of the inner wiring 28 and the buffer members 32 (S18).

Also, a protective film 38 is formed on the outer wiring 20 and ball-shaped terminals 18 are formed on the buffer members 32, and the semiconductor integrated device implemented as a chip-sized package is completed by cutting along the scribe lines (S20).

For example, in the case of adopting a chip-sized package in a CCD image sensor, since the semiconductor integrated device 24 side is a light-receiving surface, a transparent material such as glass having high optical transmittance is used at least in the first support substrate 12. Epoxy resin or the like having high transmittance can also be used in the insulating resin for fastening the first support substrate 12 and the semiconductor chip 10.

On the other hand, in the case of using an organic material such as epoxy resin in the insulating resin 17 for fastening the second support substrate 14, stress is generated between the insulating resin 17 and the semiconductor substrate 22 due to different thermal expansion coefficients. As a result, problems arise such as twisting of and degradation in the characteristics of the semiconductor chip 10. For this reason, filler having grains, such as silicon dioxide ($SiO_2$) or magnesium oxide having a lower thermal expansion coefficient than an organic material (microparticles) is mixed in with the insulating resin 17 for fastening the semiconductor chip 10 and the second support substrate 14, to make the overall thermal expansion coefficient consistent with the thermal expansion coefficient of the semiconductor substrate 22.

SUMMARY OF THE INVENTION

However, in the case of fastening the semiconductor chip 10 and the second support substrate 14 using insulating resin 17 mixed with filler, other problems arise in that the characteristics of the semiconductor integrated device deteriorate in accordance with thickness of the insulating resin 17 becoming thinner, or the semiconductor device is completely destroyed.

The present invention is directed to a semiconductor integrated device, provided with a semiconductor chip on which a semiconductor integrated circuit is formed and a support substrate laminated on at least one surface of the semiconductor chip, wherein resin that is a mixture of microparticles is filled between the semiconductor chip and the support substrate, and a distance between the semiconductor chip and the support substrate is larger than the maximum particle diameter of the microparticles.

Further, another aspect of the present invention is a method of manufacturing a semiconductor integrated device, comprising a first step of coating resin mixed with microparticles on at least one surface of a semiconductor substrate on which a semiconductor integrated circuit is formed, and laminating a support substrate on the semiconductor substrate to hold the resin between the two substrates, and a second step of pushing the support substrate against the semiconductor substrate, wherein, in the second step, the support substrate is pushed against the semiconductor substrate while keeping a distance between the semiconductor substrate and the support substrate larger than the maximum particle diameter of the microparticles.

A further aspect of the present invention is directed to a method of manufacturing a semiconductor integrated device, comprising a first step of coating a first resin layer mixed with microparticles on at least one surface of a semiconductor substrate on which a semiconductor integrated circuit is formed, a second step of hardening the first resin layer coated in the first step, and a third step of coating a second resin layer not containing microparticles on the first resin layer hardened in the second step, wherein, in the second step, hardening is carried out so that the film thickness of the first resin layer after hardening is kept larger than the maximum particle diameter of the microparticles.

DESCRIPTION OF THE PREFERRED EMBODIMENT

First Embodiment

A first embodiment will now be described in detail with reference to the drawings.

Structure of a Semiconductor Integrated Device

Figure 1:
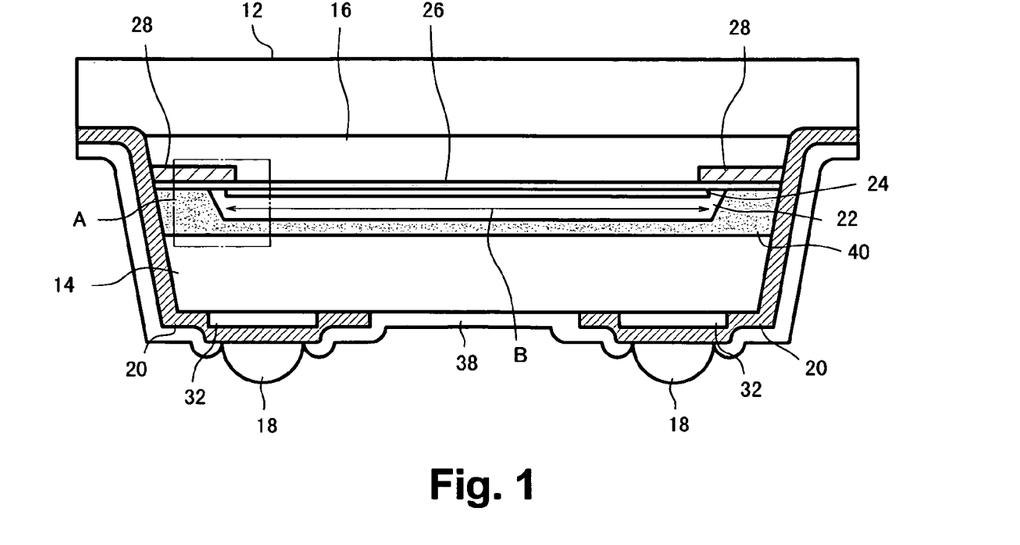
FIG. 1 is a cross sectional drawing of the structure of a semiconductor integrated device of the first embodiment of the present invention.

FIG. 1 shows a cross section of the structure of a semiconductor integrated device of the first embodiment. The semiconductor integrated device of the first embodiment has the similar structure as a semiconductor integrated device adopting a chip-sized package of the related art.

That is, a semiconductor integrated circuit 24 is formed on a surface of a semiconductor substrate 22, and an insulating film 26 is formed in this semiconductor integrated circuit 24. Also, inner wiring 28 is connected via through-holes provided in the insulating film 26 to form a semiconductor chip. The inner wiring 28 has end sections exposed at a side surface of the semiconductor chip, and is used to achieve contact between the semiconductor integrated circuit 24 and external wiring 20.

Respective first and second support substrates 12 and 14 are fastened to the front surface and rear surface of the semiconductor chip, respectively. Buffer members 32 are arranged in an outer surface of the second support substrate 14, and ball-shaped terminals 18 are provided on the support members 32. End sections of the inner wiring 28 exposed at the side surface of the semiconductor chip and the ball-shaped terminals 18 are connected using outer wiring 20 formed on the side surface of the semiconductor chip. Also, a protective film 38 is provided so as not to expose the outer wiring 20 and the second support substrate 14 to the outside.

The first support substrate 12 is fastened to the semiconductor chip using insulating resin 16, as with the related art. For example, in the case where the semiconductor integrated circuit 24 formed on the surface of the semiconductor substrate 22 is a CCD image sensor, a transparent material such as a glass plate having high light transmittance is used in the first support substrate 12. Epoxy resin or the like having high transmittance can also be used in the insulating resin 16.

On the other hand, the second support substrate 14 is fastened to the semiconductor chip using insulating resin 40. Filler (microparticles) for reducing a difference in coefficient of thermal expansion to that of the semiconductor substrate 22 contained in the semiconductor chip is mixed into the insulating resin 40.

Figure 2:
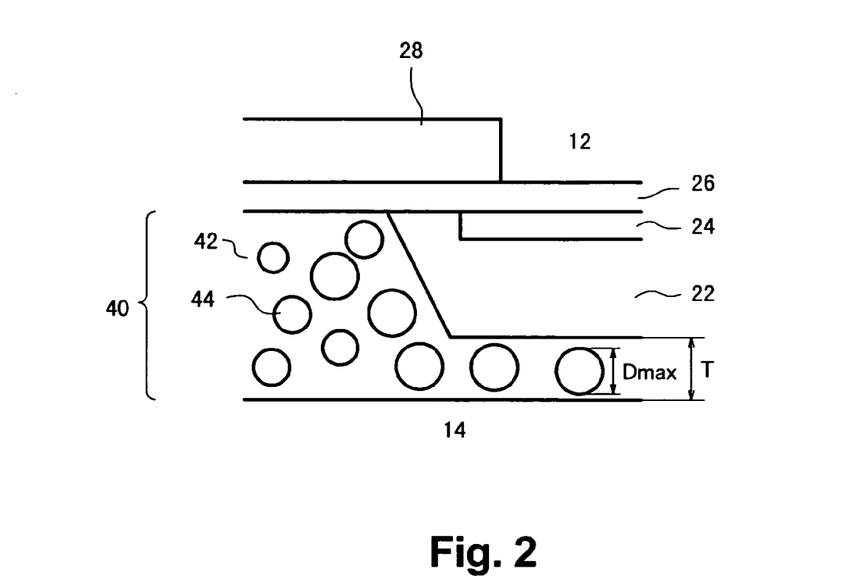
FIG. 2 is an enlarged cross sectional drawing of an insulating resin section of the semiconductor integrated device of the first embodiment of the present invention.

FIG. 2 shows an enlarged cross section of the structure of the semiconductor integrated device of this embodiment. The enlarged cross section is an enlargement of a rectangular area A in FIG. 1, but in order to simplify the description, the insulating resin 40 is shown in an exaggerated manner.

The insulating resin 40 has organic or inorganic resin material 42 as a made component. Filler 44 that is particles of silicon dioxide ($SiO_2$) or magnesium oxide (MgO) is mixed in with the resin material 42. The filler 44 is not limited to these materials, and can be any material that causes the overall coefficient of thermal expansion of the insulating resin 40 to approach that of the semiconductor substrate 22 contained in the semiconductor chip.

In this case, the film thickness T of the insulating resin 40 at fastening locations satisfies the equation (1) with respect to maximum particle diameter Dmax of the filler 44 mixed in with the insulating resin 40.

Equation (1)

$$T < Dmax \qquad (1)$$

The conditions of equation 1 are preferably satisfied at all regions where the insulating resin 40 is used, but in particular, it is preferable that the maximum particle diameter Dmax of the filler 44 and the film thickness T of the insulating resin 40 satisfy the relationship of equation 1 at least an effective element region B where the semiconductor integrated circuit 24 is formed, shown in FIG. 1.

Method of Manufacturing the Semiconductor Integrated Device

Figure 3:
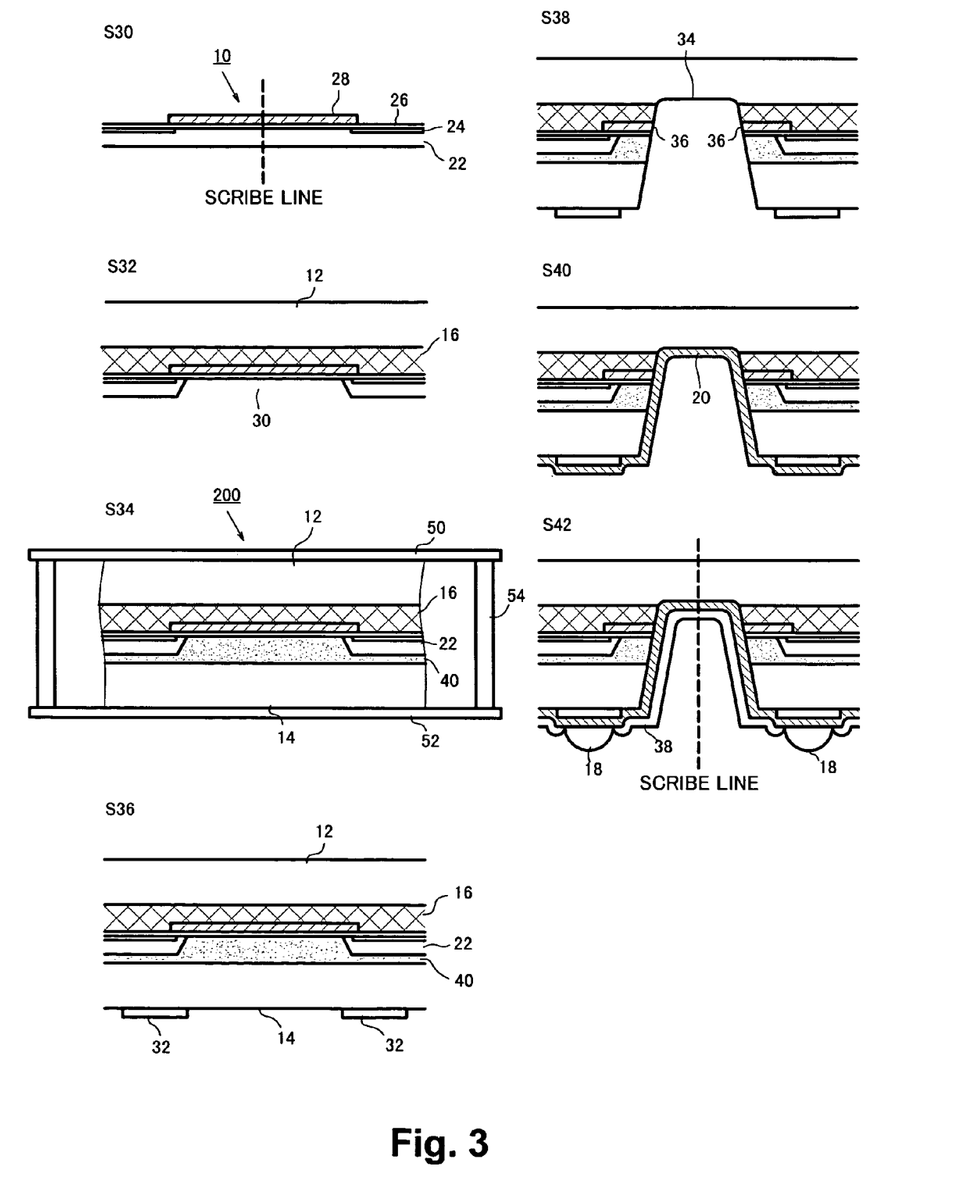
FIG. 3 is a process flow drawing for the semiconductor integrated device of the first embodiment of the present invention.

The semiconductor integrated device of this embodiment of the present invention can be manufactured following the process flow shown in FIG. 3.

In step S30, as with the related art, the semiconductor integrated circuit 24 is integrated onto the surface of the 22. The insulating film 26, such as an oxide film, is formed on the semiconductor integrated circuit 24, and inner wiring 28 is connected by means of through holes provided in the insulating film 26 to form the semiconductor chip 10.

In step S32, the insulating resin 16 is coated on to the surface of the semiconductor substrate 22 using spin coating or the like, the first support substrate 12 is pasted by means of this insulating resin 16 and the insulating resin 16 is hardened through heating. Next, contact sections 30 are formed by grinding the semiconductor substrate 22 along scribe lines from the rear surface side of the semiconductor chip 10. Grinding of the semiconductor substrate 22 can be carried out by any of mechanical grinding, chemical etching or physical etching, or using a combination of these.

Before moving to the next step of fastening the second support substrate 14, it is preferable to also grind areas constituting fastening surfaces so as to reduce unevenness of the rear surface of the semiconductor chip. However, in the case of carrying out mechanical grinding, fine scratches are produced at the grinding sites, and since it is difficult to adjust the thickness of the insulating resin 40 when fastening the support substrate 14 later due to unevenness of the scratches, and because there is degradation of the semiconductor integrated circuit 24, it is preferable to carry out etching using a method other than mechanical grinding. For example, it is preferable to carry wet etching using a mixed solution of hydrofluoric acid and nitric acid, or dry etching using sulfur hexafluoride ($SF_6$).

Specifically, it is possible to carry out etching by supplying sulfur hexafluoride ($SF_6$) and oxygen ($O_2$) at a pressure of 250 mTorr and applying a high frequency (RF) voltage of frequency 40 MHz and power 2200 W to the semiconductor chip 10. Here, in order to carry out etching at high speed and in a uniform manner, it is preferable to also apply a rotating magnetic field at the same time. Under these conditions, it is possible to achieve an etching rate of about 50 µm when the semiconductor substrate 22 is a silicon substrate.

As a result, it is possible to suppress the occurrence of unevenness due to etching, and together with doing away with the need to provide extra thickness on the insulating resin 40 it is possible to easily adjust the film thickness of the insulating resin 40.

Figure 4:
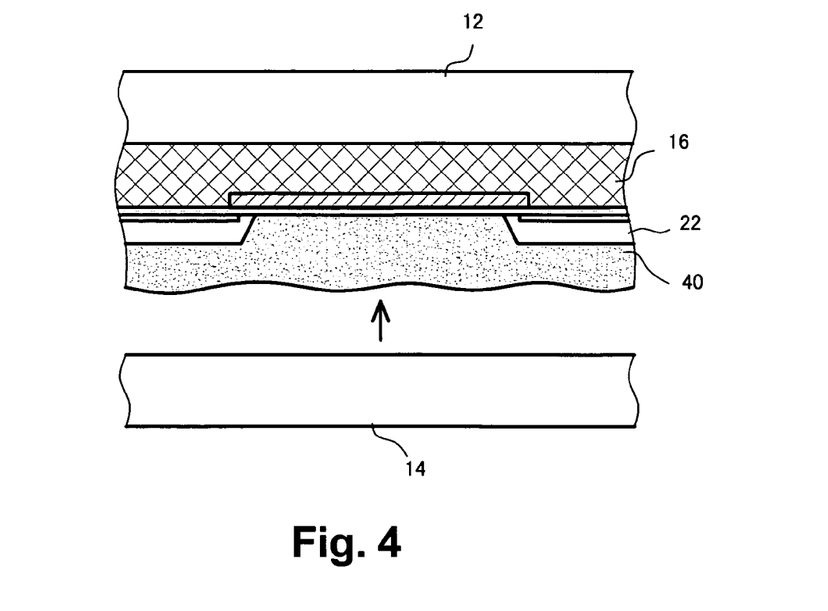
FIG. 4 is a drawing for describing a preliminary fastening process for a support substrate in the embodiment of the present invention.

In step S34, as shown in FIG. 4, the insulating resin 40 is coated onto the rear surface of the semiconductor substrate 22 and the second support substrate 14 is pasted.

Figure 5:
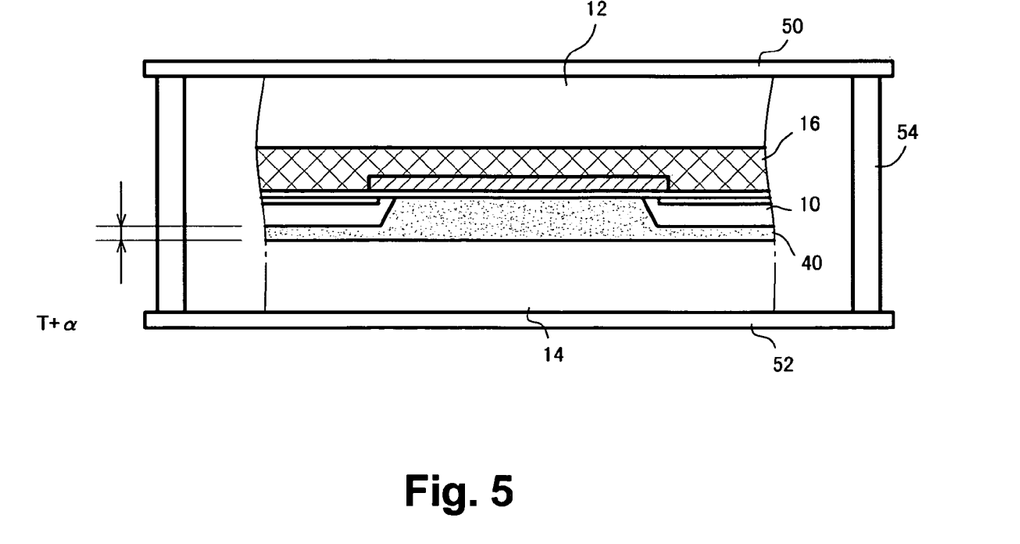
FIG. 5 is a drawing for describing adjustment of film thickness of insulating resin in the embodiment of the present invention.

In the process of step S34, as shown in FIG. 5, the second support substrate 14 is pushed against the semiconductor substrate 22 while keeping the first support substrate 12 and the second support substrate 14 parallel using an upper fixing jig 50 and a lower fixing jig 52 that is grounded parallel with respect to the upper fixing jig 50. At this time, the insulating resin 40 is regulated to a specified film thickness to carry out fastening by adjusting a gap between the upper fixing jig 50 and the lower fixing jig 52 using a film thickness adjustment jig 54. In particular, since heat treatment for hardening the insulating resin 40 is carried out in a later step, it is preferable to regulate a film thickness T' of the insulating resin 40 so as to satisfy equation (2) taking into consideration the fact that the film thickness of the insulating resin 40 will be reduced by the heat treatment.

Equation (2)

$$T' \geq T + \alpha \qquad (2)$$

T: Film thickness of insulating resin required after heat treatment>Dmax

α: Film thickness of insulating film contracted by heat.

Specifically, film thickness T' of the insulating resin 40 is made greater than or equal to a film thickness obtained by adding a film thickness T greater than the maximum particle diameter Dmax of the filler 44 contained in the insulating resin 40 to a film thickness α of the insulating resin 40 contracted due to the heat treatment.

Figure 6:
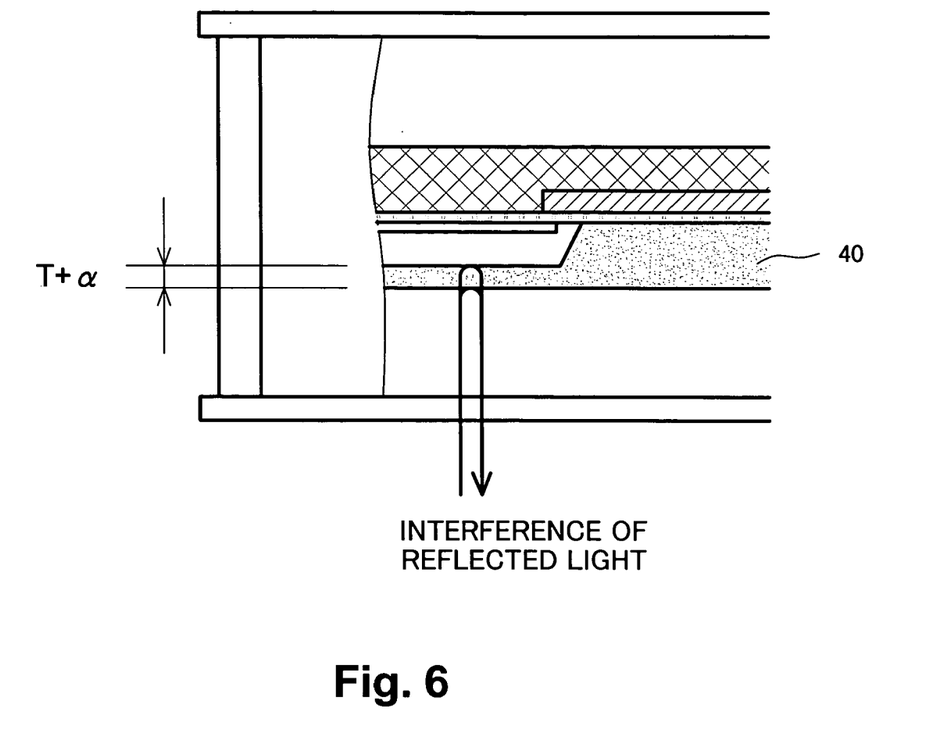
FIG. 6 is a drawing for describing a method of measuring film thickness of insulating resin in an embodiment of the present invention.
Figure 7:
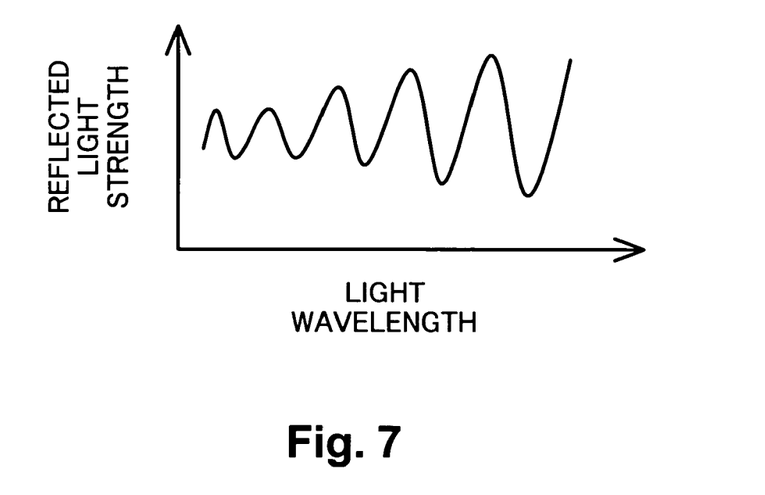
FIG. 7 is a drawing showing the appearance of interference of reflected light obtained in measurement of the insulating resin film thickness.

More specifically, as shown in FIG. 6, it is possible to measure film thickness of the insulating resin 40 by irradiating light from the lower fixing jig 52 through the second support substrate 14 and measuring interference between reflected light from an interface between the second support substrate 14 and the insulating resin 40 and an interface between the insulating resin 40 and the semiconductor chip 10, and it is also possible to regulate film thickness of the insulating resin 40 by adjusting the length of the film thickness adjustment jig 54. One example of results of measuring of the interference of the measured reflected light is shown in FIG. 7. It is possible to measure film thickness of the insulating resin 40 from wavelength dependence of the interference peak interval etc. on the reflected light spectrum.

Since film thickness of the insulating resin 40 must be adjusted with micrometer precision, it is preferable to use piezo elements formed of a piezoelectric material in the film thickness adjustment jig 54 and to carry out feedback control using measurement results of the film thickness of the insulating resin 40 to adjust the length of the film thickness adjustment jig 54.

Also, in the case where a glass plate or the like is used as the first and second support substrates 12 and 14, a distance between the support substrates 12 and 14 and the semiconductor chip 10 is different at a central part and peripheral parts because of flexing due to dead weight. In order to prevent this flexing, it is preferable to have a structure for attaching the first support substrate 12 and the second support substrate 14 in the upper fixing jig 50 and the lower fixing jig 52. For example, holes for vacuum attachment are provided in the upper fixing jig 50 and the lower fixing jig 52, and it is preferable to paste the first and second support substrates 12 and 14 to the semiconductor chip 10 while support substrate 12, and 14 are vacuum attached and kept parallel to each other.

In step S36, the insulating resin 16 and the insulating resin 40 are hardened and the first support substrate 12, second support substrate 14 and the semiconductor chip 10 are completely fastened. If heat treatment is carried out with the upper fixing jig 50, lower fixing jig 52 and film thickness adjustment jig 54 still attached, stress is applied to the semiconductor chip 10 and to the first and second support substrates 12 and 14 in accordance with contraction of the insulating resin 16 and insulating resin 40, and there may be cases where damage to the first and second support substrates 12 and 14 or destruction of the semiconductor integrated circuit 24 formed on the semiconductor chip 10 arise. It is therefore preferable to carry out the heat treatment with the upper fixing jig 50, lower fixing jig 52 and film thickness adjustment jig 54 removed.

In step S34, by regulating the film thickness T' of the insulating resin 40 to be larger than a total film thickness of a film thickness T that is larger than the maximum particle diameter Dmax of the filler 44 and a film thickness α of the insulating resin 40 contracted by the heat treatment, it is possible to keep the final film thickness T of the insulating resin 40 larger than the maximum particle diameter Dmax of the filler 44 even if the insulating resin 40 contracted by film thickness α due to the heat treatment.

After the heat treatment, buffer members 32 are provided on the outer surface of the second support substrate 14 and processing transfers to the next step.

In step S38, an inverse V-shaped groove 34 exposing the end sections 36 of the inner wiring 28 is formed at an inner surface by cutting along the scribe line from the second support substrate 14 side using a dicing saw. In step S40, a metal film is formed on an outer surface of the second support substrate 14 and an inner surface of the groove 34, and outer wiring 20 is formed by patterning this metal film using a photolithography technique. Finally, in step S42, a protective film 38 and ball shaped terminals 18 are formed, and the semiconductor integrated device is formed by cutting along the scribe line using a dicing saw.

According to the semiconductor integrated device of the embodiment formed as described above, even if filler is mixed in with resin for fastening the semiconductor chip and the support substrates, it is possible to prevent problems such as degradation in the characteristics of the semiconductor integrated device and the semiconductor integrated device being completely destroyed. At the same time, it is also possible to reduce thermal stress on the semiconductor integrated device.

These effects are anticipated to be achieved by the fact that there is no longer contact between a single filler and the support substrate and the semiconductor chip at the same time, by making film thickness of the insulating resin larger than the maximum particle diameter of the filler contained in the insulating resin, and there will no longer be a concentrating of stress generated by the filler being pressed against contact points between the filler and the semiconductor chip by pressure from the support substrate.

Second Embodiment

A second embodiment will now be described with reference to the drawings.

Structure of the Semiconductor Integrated Device

Figure 10:
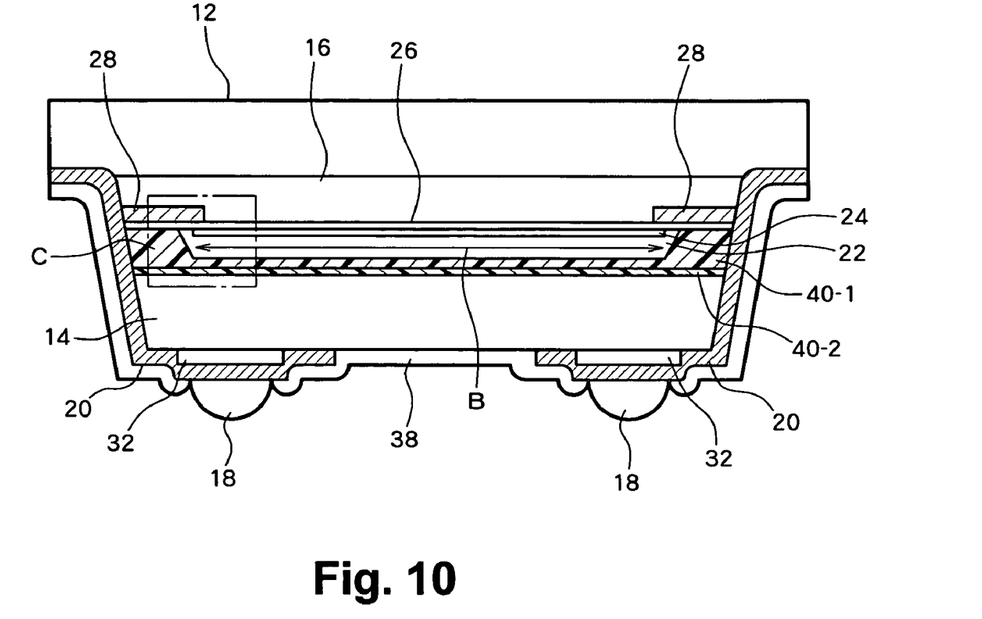
FIG. 10 is a cross sectional drawing of the structure of a semiconductor integrated device of the second embodiment of the present invention.

A cross section of the structure of the semiconductor integrated device of the second embodiment is shown in FIG. 10. The semiconductor integrated device of this embodiment has the similar structure as the semiconductor integrated device of the fist embodiment adopting a chip-sized package, but is characterized by the fact that the insulating resin 40 is divided into two layers, namely an insulating resin layer 40-1 and an insulating resin layer 40-2.

The second support substrate 14 is fastened to the semiconductor chip using the insulating resin layer 40-1 and the insulating resin layer 40-2. A filler for reducing a difference in coefficient of thermal expansion between the insulating resin layer 40-1 and the semiconductor substrate 22 contained in the semiconductor chip is mixed in with the insulating resin layer 40-1. On the other hand, there is no filler mixed in with the insulating resin layer 40-2.

Figure 11:
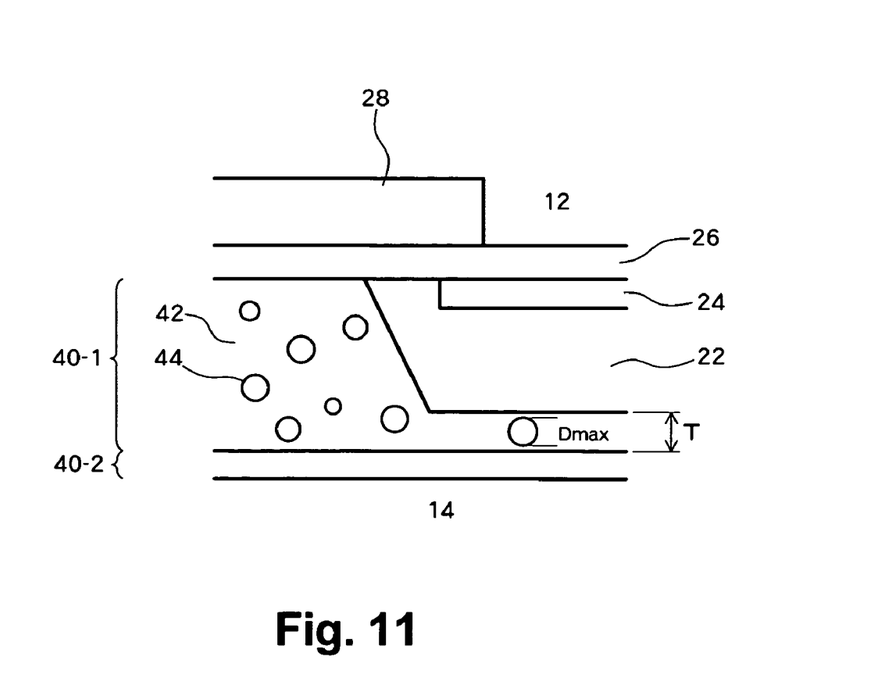
FIG. 11 is an enlarged cross sectional drawing of an insulating resin section of the semiconductor integrated device of the second embodiment of the present invention.

FIG. 11 is an enlarged cross section of the structure of the semiconductor integrated device of this embodiment. The enlarged cross sectional drawing is an enlargement of a rectangular area C in FIG. 10, but in order to simplify the description the insulating resin layer 40-1 is shown in an exaggerated manner.

Similarly to the first embodiment, the insulating resin layer 40-1 comprises organic or inorganic resin as a main material. Filler 44 contained in the insulating resin layer 40-1 are preferably particles of silicon dioxide ($SiO_2$) or Magnesium oxide (MgO). Specifically, the filler 44 can be any material that causes the coefficient of thermal expansion of the insulating resin layer 40-1 overall to approach that of the semiconductor substrate 22 contained in the semiconductor chip.

In this case, the film thickness T of the insulating resin layer 40-1 at fastening locations and the maximum particle diameter Dmax of the filler 44 contained in the insulating resin layer 40-1 are regulated so as to satisfy the conditions of equation (1) above. The conditions of equation (1) are preferably satisfied in all regions where the insulating resin layer 40-1 is used, but it is particularly preferred that the conditions are satisfied in at least an effective element region B where the semiconductor integrated circuit 24 shown in FIG. 10 is formed.

Method of Manufacturing the Semiconductor Integrated Device

Figure 12:
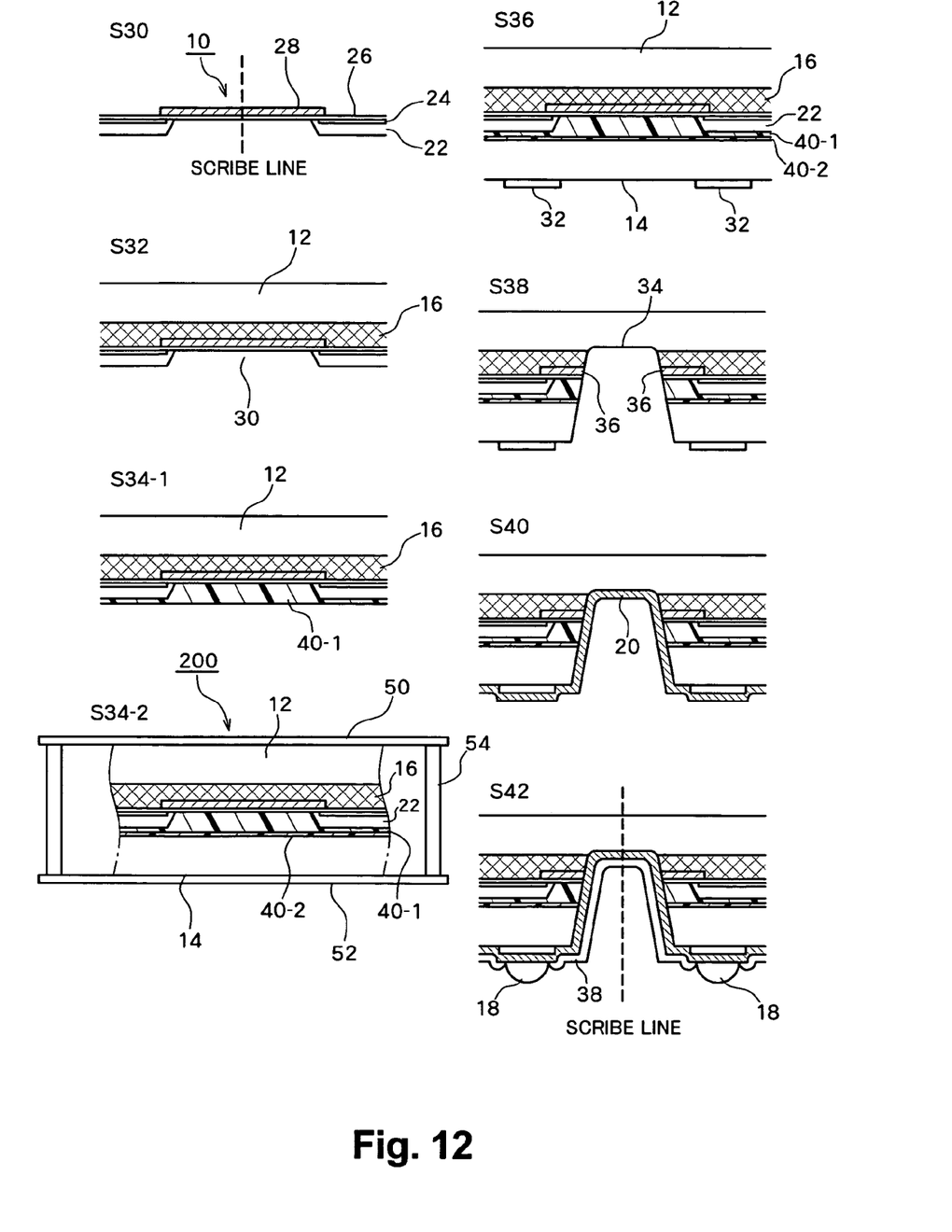
FIG. 12 is a process flow drawing for the semiconductor integrated device of the second embodiment of the present invention.

The semiconductor integrated device of this embodiment can be manufactured using the process flow shown in FIG. 12. In FIG. 12, processes that are the same as those performed in the first embodiment described above are assigned the same reference numerals.

In step S30, the semiconductor integrated circuit 24 is integrated onto the surface of the semiconductor substrate 22, the insulating film 26, such as an oxide film, is formed on the semiconductor integrated circuit 24, and inner wiring 28 is connected by means of through holes provided in the insulating film 26. In this way the semiconductor chip 10 is formed.

In step S32, the insulating resin 16 is coated on to the surface of the semiconductor substrate 22 using spin coating or the like, and the first support substrate 12 is pasted by means of this insulating resin 16. The first support substrate 12 is fixed to the surface of the semiconductor substrate 22 by heat hardening the insulating resin 16. Next, contact sections 30 are formed by grinding the semiconductor substrate 22 along a scribe line (shown by the dotted line in the drawing) from the rear surface side of the semiconductor chip 10. Grinding of the semiconductor substrate 22 can be carried out by any of mechanical grinding, chemical etching or physical etching, or using a combination of these.

In this case, similarly to the first embodiment, it is preferable to also grind areas constituting fastening surfaces so as to reduce unevenness of the rear surface of the semiconductor chip. Also, in the case of carrying out mechanical grinding, in order to prevent the problem where fine scratches are produced at the grinding sites, it is preferable to carry out etching using a method other than mechanical grinding. For example, it is preferable to carry wet etching using a mixed solution of hydrofluoric acid and nitric acid, or dry etching using sulfur hexafluoride ($SF_6$). Etching can be carried out in the same way as with the first embodiment.

In step S34-1, the insulating resin layer 40-1 is formed on the rear surface of the semiconductor substrate 22. Insulating resin containing filler is coated using spin coating or the like, and the insulating resin layer 40-1 is formed by hardening by heat treatment or the like.

Here, as shown in FIG. 11, the film thickness T' of the insulating resin layer 40-1 is preferably regulated so as to satisfy equation (2), taking into consideration that the film thickness of the insulating resin is reduced as a result of the heat treatment to cause hardening.

Specifically, the insulating resin layer 40-1 is preferably coated to a film thickness T' that is equal to or greater than a film thickness obtained by adding a film thickness T that is larger than the maximum particle diameter Dmax of filler 44 contained in the insulating resin layer 40-1 and a film thickness α contracted due to heat treatment.

For example, when coating the insulating resin using spin coating, it is possible to coat the insulating resin so as to satisfy equation (2) above by adjusting the resin viscosity spin coating rotation speed and rotation time. Without compressing the insulating resin coated in this way, it is hardened until there is no variation in film thickness even if subjected to compression or the like. In this way, as described above, it is possible for the film thickness T of the insulating resin layer 40-1 after hardening and the maximum particle diameter Dmax of the filler 44 contained in the insulating resin layer 40-1 to satisfy the conditions of equation (1) above.

In step 34-2, the insulating resin layer 40-2 is formed on the rear surface of the semiconductor substrate 22 and the second support substrate 14 is pasted. The second support substrate 14 is pushed against the semiconductor substrate 22 while keeping the first support substrate 12 and the second support substrate 14 parallel using an upper fixing jig 50 and a lower fixing jig 52 that is grounded parallel with respect to the upper fixing jig 50. At this time, the total film thickness of the insulating resin layer 40-1 and the insulating resin layer 40-1 is regulated to a specified film thickness by adjusting a gap between the upper fixing jig 50 and the lower fixing jig 52 using a film thickness adjustment jig 54. Specifically, as with the first embodiment, it is possible to regulate the total film thickness of the insulating resin layer 40-1 and the insulating resin layer 40-1 by adjusting the length of the film thickness adjustment jig 54 while carrying out film thickness measurement utilizing light interference.

Also, as with the first embodiment, in the case of using a glass plate as the first and second support substrates, it is preferable to have a structure where the first support substrate 12 and the second support substrate 14 are attached to upper fixing jig 50 and the lower fixing jig 52 in order to prevent flexing due to dead weight. In this way, it is desirable to paste the first and second support substrates 12 and 14 to the semiconductor chip 10 while keeping them parallel.

In step S36, the insulating resin 16 and the insulating resin layer 40-1 and insulating resin layer 40-2 are completely hardened by carrying out heat treatment. In this way, the first support substrate 12 and second support substrate 14, and the semiconductor chip 10, are fastened. In this case, as with the first embodiment, in order to prevent destruction of the semiconductor integrated circuit 24 due to stress, it is preferable to carry out the heat treatment with the upper fixing jig 50, lower fixing jig 52 and film thickness adjustment jig 54 removed. After heat treatment, buffer sections are provided on the outer surface of the second support substrate 14 and processing proceeds to the next step.

In step S34-1, the thickness T of the insulating resin layer 40-1 is made larger than the maximum particle diameter Dmax of the filler 44, and in step S34-2 it is possible to keep the total film thickness of the insulating resin layer 40-1 and insulating resin layer 40-2 larger than the maximum particle diameter Dmax of the filler 44, even if there is compression, by causing hardening in advance to such an extent that there is no variation in film thickness.

In steps S38–S42, an inverse V-shaped groove 34 having the end sections 36 of the inner wiring 28 formed exposed at an inner surface is formed using a dicing saw, outer wiring 20 patterned on the outer surface of the second support substrate 14 and the inner surface of the groove 34 is formed, and after formation of a protective film 38 and ball-shaped terminals 18 the semiconductor integrated device is formed by cutting along a scribe line using a dicing saw.

According to this embodiment, even in the case of mixing filler into insulating resin for fastening a semiconductor chip and a support substrate, it is possible to prevent problems such as degradation of characteristics of a semiconductor integrated device and complete destruction of the semiconductor integrated device. At the same time, it is possible to reduce thermal stress on the semiconductor integrated device.

These effects mean that there is no longer contact between a single filler and the support substrate and the semiconductor chip at the same time, due to the fact that the film thickness T of the insulating resin layer 40-1 is made larger than the maximum particle diameter Dmax of the filler 44 contained in the insulating resin layer 40-1, that is, the total film thickness of the insulating resin layer 40-1 and the insulating resin layer 40-2 is made larger than the maximum particle diameter Dmax of the filler 44, and it is anticipated that it will be possible to prevent concentrating of stress from the filler.

With this embodiment, the insulating resin 40 is made up of the two layers, namely the insulating resin layer 40-1 and the insulating resin layer 40-2, but thus is not limiting. That is, it is also possible to have a structure with three or more insulating resin layers, as long as the concept of the present invention is satisfied.

What is claimed is:

1. A method of manufacturing a semiconductor integrated device, comprising:
    a first step of laminating a semiconductor substrate on which a plurality of semiconductor chips are formed and a support substrate with resin mixed with microparticles being interposed between the semiconductor substrate and the support substrate;
    a second step of pushing the support substrate against the semiconductor substrate;
    a third step of arranging wiring to achieve contact from the semiconductor chips; and
    a fourth step of dividing the semiconductor chips alone scrub lines to form the semiconductor integrated device, and wherein
    in the second step, the support substrate is pushed against the semiconductor substrate while keeping a distance between the semiconductor substrate and the support substrate larger than the maximum particle diameter of the microparticles.

2. The method of manufacturing a semiconductor device of claim 1, further comprising a step of hardening the resin by subjecting it to a heat treatment process after the second step, and wherein in the second step the distance between the semiconductor substrate and the support substrate is kept larger than the sum of a contraction amount by which the film thickness of the resin contracts during the hardening step and the maximum particle diameter of the microparticles.

3. The method of manufacturing a semiconductor device of claim 1, further comprising, before the first step, a step of etching the semiconductor substrate to reduce the thickness of the semiconductor substrate.

4. A method of manufacturing a semiconductor integrated device, comprising:
- a first step of coating a first resin layer mixed with microparticles on at least one surface of a semiconductor substrate on which a semiconductor integrated circuit is formed;
- a second step of hardening the first resin layer coated in the first step; and
- a third step of coating a second resin layer not containing microparticles on the first resin layer hardened in the second step, wherein
- in the second step, hardening is carried out so that the film thickness of the first resin layer after hardening is kept larger than the maximum particle diameter of the microparticles.

5. The method of manufacturing a semiconductor device of claim 4, further comprising, before the first step, a step of etching a rear surface of the semiconductor substrate to make the semiconductor substrate thin.

* * * * *